(12) United States Patent
Ishida

(10) Patent No.: US 7,179,359 B2
(45) Date of Patent: Feb. 20, 2007

(54) CUP-SHAPED PLATING APPARATUS

(75) Inventor: Hirofumi Ishida, Atsugi (JP)

(73) Assignee: Electroplating Engineers of Japan, Ltd, Tokyo (JP)

( * ) Notice: Subject to any disclaimer, the term of this patent is extended or adjusted under 35 U.S.C. 154(b) by 414 days.

(21) Appl. No.: 10/473,962

(22) PCT Filed: Oct. 11, 2002

(86) PCT No.: PCT/JP02/10595

§ 371 (c)(1),
(2), (4) Date: Sep. 30, 2003

(87) PCT Pub. No.: WO2004/033763

PCT Pub. Date: Apr. 22, 2004

(65) Prior Publication Data

US 2004/0154917 A1    Aug. 12, 2004

(51) Int. Cl.
*C25D 17/02*    (2006.01)
*C25D 7/12*    (2006.01)

(52) U.S. Cl. ............ 205/98; 204/237; 204/275.1; 204/238; 205/99

(58) Field of Classification Search ............ None
See application file for complete search history.

(56) References Cited

U.S. PATENT DOCUMENTS 5,100,517 A * 3/1992 Starinshak et al. ......... 205/138
5,391,285 A * 2/1995 Lytle et al. ................ 205/123
5,997,712 A * 12/1999 Ting et al. ................. 205/101
6,179,983 B1 * 1/2001 Reid et al. ................... 205/96
2002/0066665 A1 * 6/2002 Sakaki .................... 204/275.1

FOREIGN PATENT DOCUMENTS

JP    04-056799 A    *    2/1992

(Continued)

OTHER PUBLICATIONS

English translation of JP 04-056799 A.*

(Continued)

*Primary Examiner*—Harry D. Wilkins, III
(74) *Attorney, Agent, or Firm*—Roberts & Roberts, LLP

(57) ABSTRACT

Provided is a cup-shaped plating apparatus which can plate the whole area of a plating target surface with a uniform film thickness. In a cup-shaped plating apparatus including a placement portion of an object to be plated which is provided at an opening end of a plating tank, means for supplying a plating solution into the plating tank, a plating solution outlet port which is formed in the plating tank, a cavity portion into which the plating solution which has flown out of the outlet port flows, a plating solution discharge port within the cavity portion, and a collection tank for the plating solution discharged from the discharge port, which subjects the object to be plated to plating treatment while supplying the plating solution into the plating tank, the shape and/or opening area of the discharge port formed on the downstream side of the cavity portion can be changed. If the shape and/or opening area of the discharge port formed on the downstream side of the cavity portion can be adjusted, it is possible to suppress nonuniform plating and variations in plating on a plating target surface by adjusting the shape and/or opening area.

14 Claims, 6 Drawing Sheets

FOREIGN PATENT DOCUMENTS

| JP | 2002-080995 A | | 3/2002 |
|---|---|---|---|
| JP | 2002-129385 A | | 5/2002 |
| JP | 2002-173794 A | * | 6/2002 |
| JP | 2002-129384 A | | 5/2003 |

OTHER PUBLICATIONS

Sakaki Yasuhiko, "Cup Type Plating Apparatus", Patent Abstracts of Japan, Publication No. 2002-173794, Date of Publication of Application: Jun. 21, 2002.

Tachihaba Yoshito Nobata Hiroyoshi, "Plating Treatment Device", Patent Abstracts of Japan, Publication No. 2000-345386, Date of Publication of Application: Dec. 12, 2000.

Kato Kazuo, et al., "Plating Solution Circulating Device for Continuous Electroplating Device", 2 pages.

Ishida Hirobumi, "Plating Method and Plating Device", Patent Abstracts of Japan, Publication No. 2002-322589, Date of Publication of Application: Nov. 8, 2002.

* cited by examiner (a) SECTION A-A (b)

CUP-SHAPED PLATING APPARATUS

TECHNICAL FIELD

The present invention relates to an apparatus for subjecting metals, semiconductor wafers, etc. to plating treatment and, more particularly, to the so-called a cup-shaped plating apparatus.

BACKGROUND ART

As one type of plating apparatus there is available a cup-shaped plating apparatus 100 used for the plating of wafers etc. As shown in FIG. 6, the cup-shaped plating apparatus 100 is provided with a plating tank 101 and a wafer placement portion 106 in a top opening of the plating tank 101. Within the plating tank is provided an anode (a positive electrode) 105, which is one electrode for electrolytic plating. Also, a cathode (a negative electrode) which is the other electrode for the same, a silver packing 107, etc. are attached to the placement portion 106. That is, when a wafer W is placed on the placement portion, a plating target surface Ws of the wafer W is brought into contact with a plating solution within the plating tank and a current is caused to flow between the two electrodes in this state, the target surface Ws is subjected to plating treatment.

This cup-shaped plating apparatus has a plating-solution-supply tube 102 connected to the bottom of the plating tank 101 and an outlet pore 104 formed in a side wall 103 of the plating tank 101 near the top opening of the plating tank, which outlet pore 104 leads to a cavity 108 within the side wall 103, and an then to an outlet 109 leading out of the apparatus. Therefore, it is possible to perform plating treatment while continuously supplying a fresh plating solution from the supply tube 102. The plating solution thus supplied flows toward the plating target surface in an upward current and flows thereafter to the outer peripheral side of the plating tank in a radially spreading pattern (refer to the Japanese Patent Application Laid-Open No. P2002-173794).

Performing plating treatment while continuously supplying a plating solution in this manner provides advantages, for example, it is possible to perform plating treatment more rapidly.

However, when plating treatment is performed during the continuous supply of a plating solution, nonuniform plating attributable to the flow of the plating solution may sometimes occur. Particularly, in the outer peripheral portion of a plating target surface of a wafer near the side wall of the plating tank, nonuniform plating and variations in plating, such as a larger plating film thickness than in the middle portion of the plating target surface, are apt to occur.

The present invention was made against a background as described above and has as its problem the provision of a cup-shaped plating apparatus which ensures that the whole area of a plating target surface is subjected to plating with a uniform film thickness.

DISCLOSURE OF THE INVENTION

To solve the above-described problem, the present inventors have devoted themselves to examining a method of improving the flow of a plating solution near the outlet port. As a result, finding out that by adjusting the shape and opening area of a discharge port, which is a plating solution outlet port in a cavity portion where a plating solution which has flowed out of the outlet port of the plating tank is stored, it is possible to ensure that the whole area of the plating target surface of an object to be plated is subjected to plating with a uniform film thickness, the present inventors have hit upon the following invention.

The present invention is a cup-shaped plating apparatus comprising a plating tank in which a plating solution is stored, a placement portion of an object to be plated which is provided at an opening end of the plating tank, means for feeding the plating solution into the plating tank, a plating solution outlet port which is formed in an inner circumferential surface of the plating tank, a cavity portion into which the plating solution which has flown out of the outlet port flows, a plating solution discharge port within the cavity portion, and a collection tank for the plating solution discharged from the discharge port, the apparatus subjecting the object to be plated which is placed on the placement portion to plating treatment while feeding the plating solution into the plating tank by use of the means for supplying the plating solution, characterized in that the apparatus has a construction which enables the shape and/or the opening area of the discharge port to be changed.

In performing plating treatment, an object to be plated is placed on the placement portion and a plating target surface of an object to be plated is brought into contact with a plating solution within a plating tank. In this state a current is caused to flow between two electrodes of an electrolytic plating apparatus and plating treatment is performed while continuously feeding the plating solution into the plating tank. By doing like this, the plating solution flows from an outlet port into a cavity portion outside the plating tank in an amount corresponding to a supply volume of plating solution. The plating solution which has flowed into the cavity portion is temporarily stored in the cavity portion and is then discharged from a discharge port into a collection tank.

In such a cup-shaped plating apparatus, the occurrence of nonuniform plating and variations in plating is suppressed by adjusting the shape and/or opening area of the discharge port formed on the downstream side of the cavity portion.

The reason for this, which is not clear, might be considered as follows. In a cavity portion 16 into which a plating solution L has flowed (refer to FIG. 5), when the plating solution L is discharged from a discharge port 31, for example, and the liquid level Ls of the plating solution L within the cavity portion 16 decreases, the pressure in a space E present above the plating solution L decreases (a negative pressure is generated). And when the pressure in the space E drops, the difference between the pressure in the space E of the cavity portion 16 (outside a plating tank 10) and the pressure in the plating tank 10 increases and the plating solution L becomes apt to flow out of the plating tank 10 into the cavity portion 16 via an outlet port 11. As a result, in the cavity portion 16 the inflow volume of plating solution L increases and the decrease in the liquid level Ls of the plating solution is suppressed. It might be thought that the liquid level of the plating solution L within the cavity portion 16 is determined by such a balance between the inflow volume of plating solution from the outlet portion 11 and the discharge volume from the discharge port. And it might be thought that by changing and adjusting the shape and opening area of the discharge port in such a plating apparatus, the ease with which the plating solution at the outlet portion of the plating tank flows out is adjusted and, at the same time, the state of flow of the plating solution in a region adjacent to the outlet port within the plating tank, i.e., in a region near the outer periphery within the plating tank changes. This region is adjacent to the outer peripheral part of the plating target surface and if the state of flow of the plating solution in this region can be changed, it is possible to adjust the plating condition in the outer peripheral part of the plating target surface and it is possible to prevent nonuniform plating and variations in plating, such as the phenomenon that the plating film thickness is larger in the outer peripheral portion of a plating target surface than in the middle portion of the plating target surface. In view of this, it might be thought that the whole area of the plating target surface can be subjected to plating with a uniform film thickness by adjusting the shape and/or opening area of the discharge port of the cavity portion.

Various types are conceivable as a structure for changing the shape and/or opening area of the discharge port. For example, there is a structure in which a hole is formed in a prescribed position of the inner wall of the cavity portion and a hole piece in which a discharge port having a prescribed size is detachably mounted in this hole. When such a structure is used, by mounting a hole piece provided with a discharge port having a desired shape or a desired opening area as required, it is possible to change, adjust or set the shape and/or opening area of the discharge port.

It is preferred that the cavity portion be formed so as to surround the plating tank. This is because if so, the outlet port can be formed on the outer peripheral surface of the plating tank along the whole circumference and because the plating solution can be discharged to outside the plating tank via the outlet port from any position in the outer peripheral region within the plating tank. When such a structure is used, the flow of the plating solution in the outer peripheral region within the plating tank becomes smoother and uniform, it is possible to more positively prevent the occurrence of non-uniformity and variations in the plating film thickness in the outer peripheral portion of the plating target surface.

And it is preferred that a plurality of discharge ports be formed on the downstream side of the flow direction of the plating solution in the cavity portion so as to surround the plating tank. For example, in a case where the cavity portion is formed so as to surround a cylindrical plating tank, the downstream side of the flow direction of the plating solution refers to a position near the bottom of the plating tank, such as a bottom end portion of the cavity portion. In a case where the discharge port is formed in such a position, even when the total opening area is the same, the occurrence of non-uniformity and variations in the plating film thickness is more positively prevented by providing a plurality of discharge ports and forming the discharge ports in a distributed state. And when a plurality of discharge ports are provided, it is preferred that discharge ports of the same size be provided at equal intervals, because the occurrence of non-uniformity and variations in the plating film thickness is still further positively prevented.

Also, it is preferred that the discharge port be in the form of a slotted hole. When the cavity portion is formed so as to surround the plating tank, discharge ports in the form of a slotted hole are arranged so that the longitudinal direction of the discharge ports is directed along the circumferential direction of the plating tank. With this arrangement, the whole area of the plating target surface can be subjected to plating with a uniform film thickness.

BEST MODE FOR CARRYING OUT THE INVENTION

A preferred embodiment of a cup-shaped plating apparatus related to the present invention will be described below with reference to the drawings.

Figure 1:
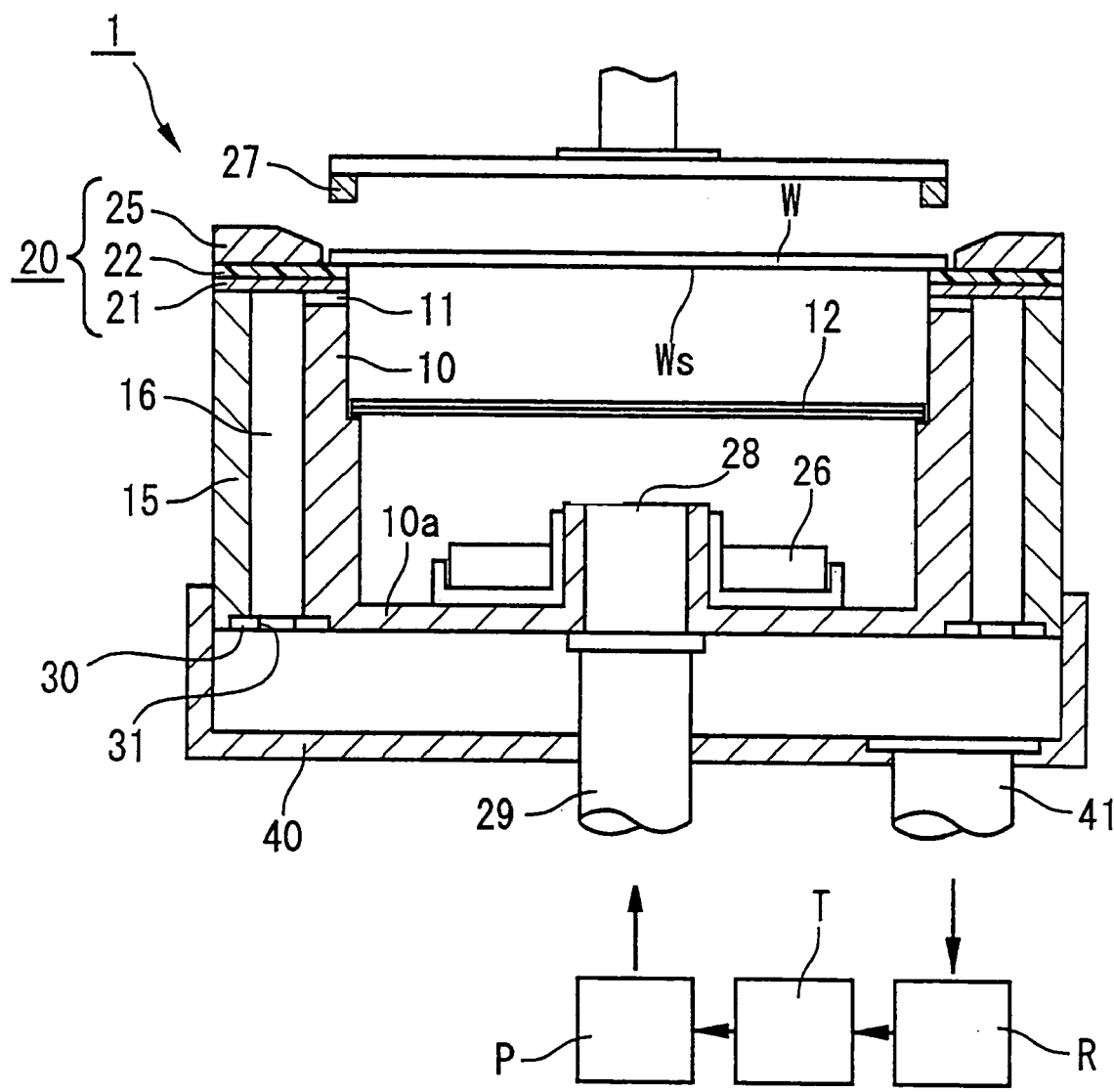
FIG. 1 is a front sectional view showing the sectional structure of a cup-shaped plating apparatus of the present embodiment.
Figure 2:
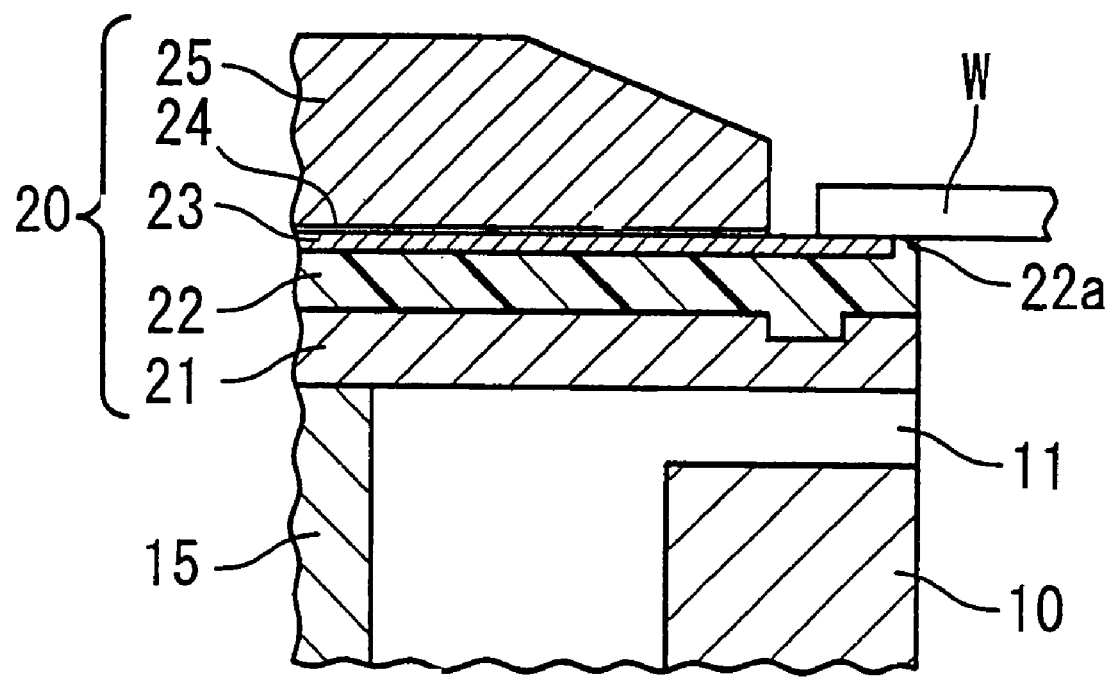
FIG. 2 is a sectional view showing the partial structure of a placement portion.

As shown in FIG. 1, a cup-shaped plating apparatus 1 has a plating tank 10 in which a plating solution is stored. A circular opening at the top end of the plating tank 10 is provided with a placement portion 20 on which an object to be plated, such as a wafer W, is placed. As shown in FIG. 2, the placement portion 20 has an annular placement bed 21 extending along an opening edge, a seal packing 22 installed on the placement bed 21, and a cathode 23 (made of Au) being one electrode installed on the seal packing 22. Also, a top ring 25 is pushed against the top side of the outer peripheral portion of the cathode 23 through the packing 24. The seal packing 22 and the cathode 23 are fixed to the plating tank 10 by means of the top ring 25 and placement bed 21. Incidentally, an anode 26, which is the other electrode for electrolytic plating, is installed on the bottom within the plating tank 10. The copper wires and power source for energizing the two electrodes 23, 26 are omitted from the illustration. And the numeral "27" denotes a holding member which pushes the substrate W against the mounting portion 20 thereby fixing the substrate W to the plating tank 10.

A plating-solution-supply tube 28 is connected to the middle position of a bottom surface 10a of the plating tank 10. The plating solution in the tank T is fed to the supply tube 28 via a pipe 29 from a pump P, and the plating solution can be continuously fed from the supply tube 28 into the plating tank 10. And an outlet port 11 for plating solution is provided in a position adjacent to the top opening of the side wall of the plating tank 10, and it is possible to cause the plating solution within the plating tank 10 to flow out of the plating tank. Within the plating tank 10, in a position above the supply tube 28 there is provided a damper 12 (rectification means) which has the function of rectifying the flow of metallic ions (or electric currents) supplied from the anode 26 and the flow of the plating solution supplied from the supply tube 28. This damper 12 is fabricated from a circular plate material in which a large number of circular through holes are formed. Within the plating tank 10 of this embodiment, this damper 12 is installed in such a condition that two dampers 12 are laminated.

As shown in FIG. 1, a cylindrical outer cover 15 which surrounds the plating tank 10 is installed outside the plating tank 10. Between the plating tank 10 and the outer cover 15, a cavity portion 16 used as a flow passage of plating solution is formed. This cavity portion 16 has an annular horizontal sectional shape and the top end of the cavity portion is closed with the placement portion 20. In its position near the top end, the cavity portion 16 communicates with the interior of the plating tank 10 via the outlet port 11. That is, the plating solution which has flowed out of the outlet port flows into the cavity portion 16. At the bottom end of the cavity portion 16 (in a position near the bottom of the plating tank), an annular plate 30 having a plurality of discharge ports 31 is provided. Therefore, the plating solution which has flowed into the cavity portion 16 is discharged through the discharge ports 31 to below the plating tank 10. In this manner, the cavity portion 16 is configured in such a manner as to be connected to the outside only via the outlet port 11 and discharge ports 31.

Figure 3:
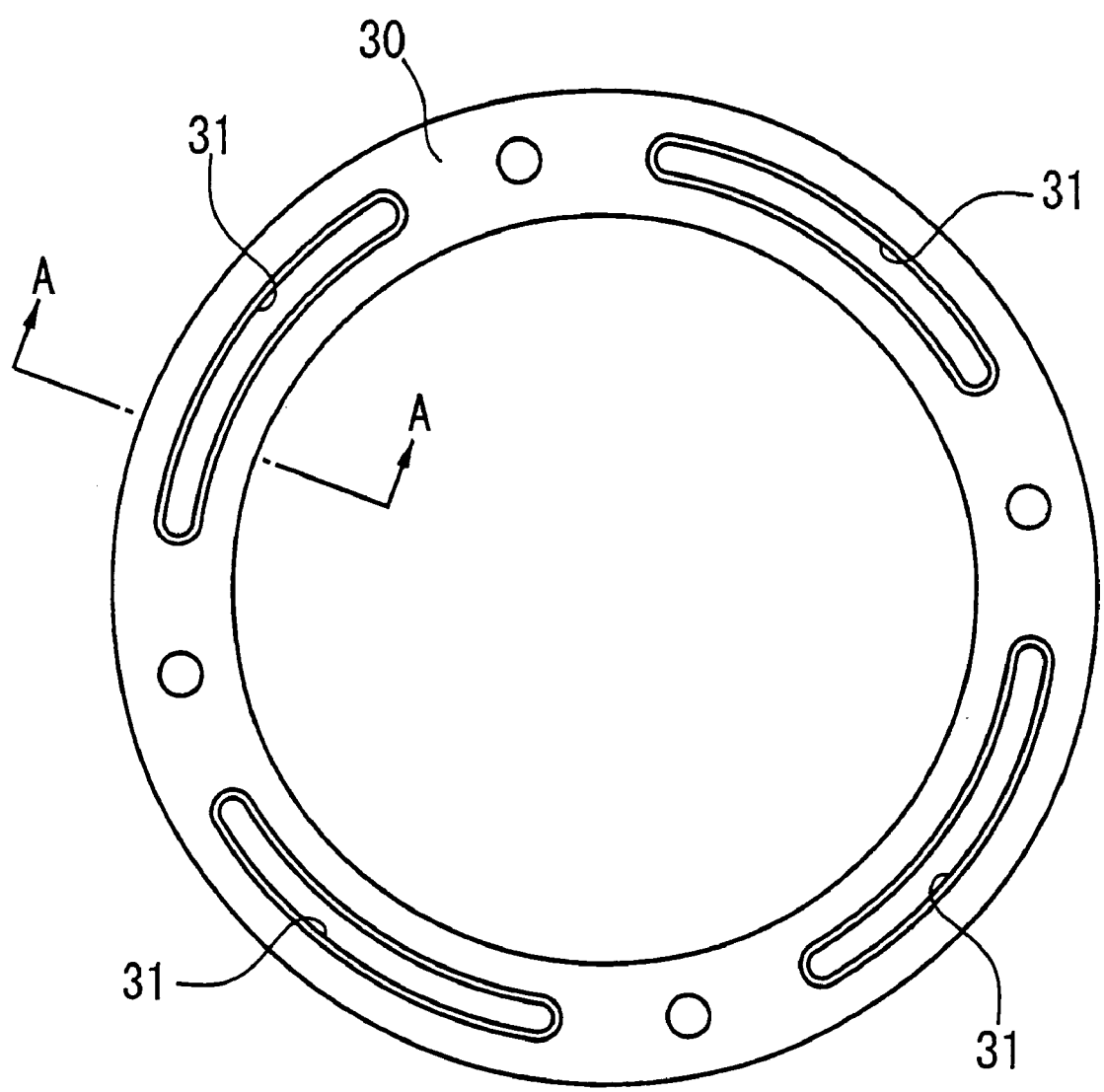
FIG. 3 is a plan view showing a plate having discharge ports.
Figure 4:
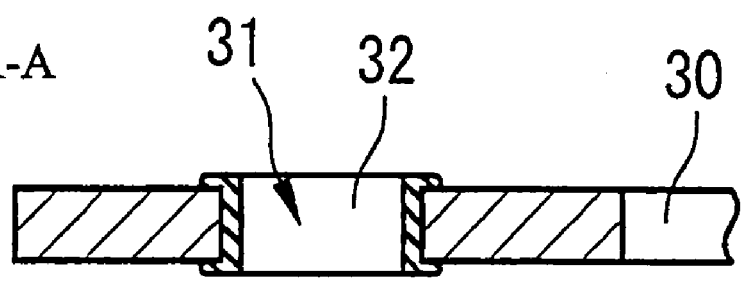
FIG. 4 is a sectional view showing the section A—A of FIG. 3.
Figure 4:
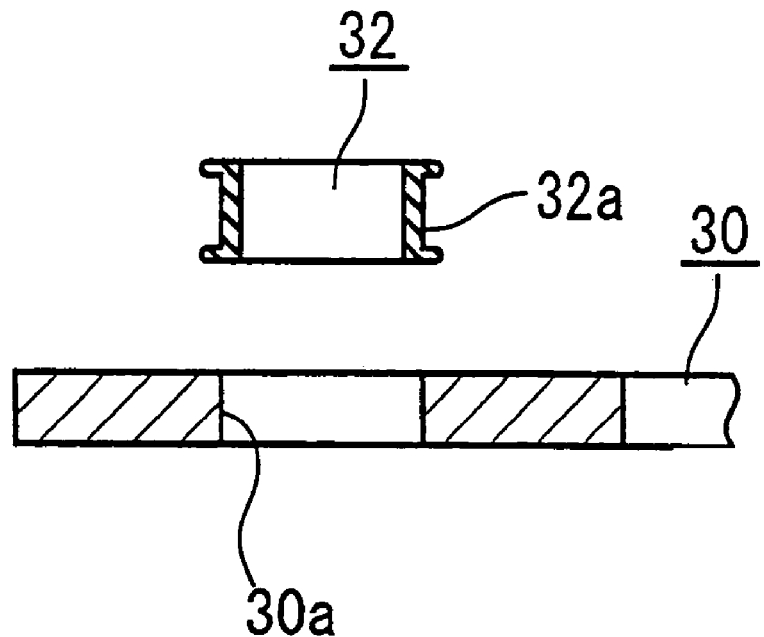
Figure 5:
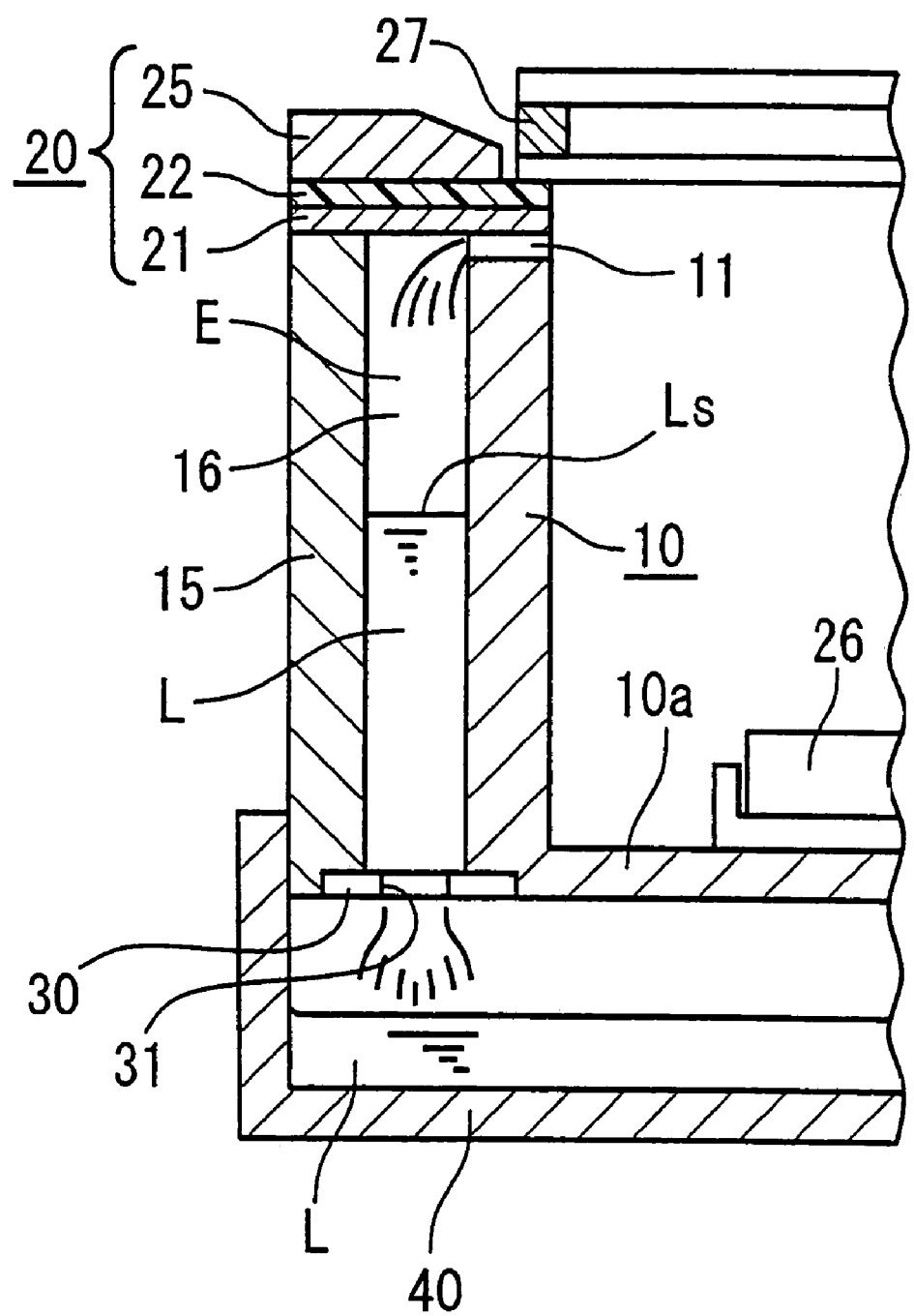
FIG. 5 is an explanatory view showing the state of a plating solution within a cavity portion.
Figure 6:
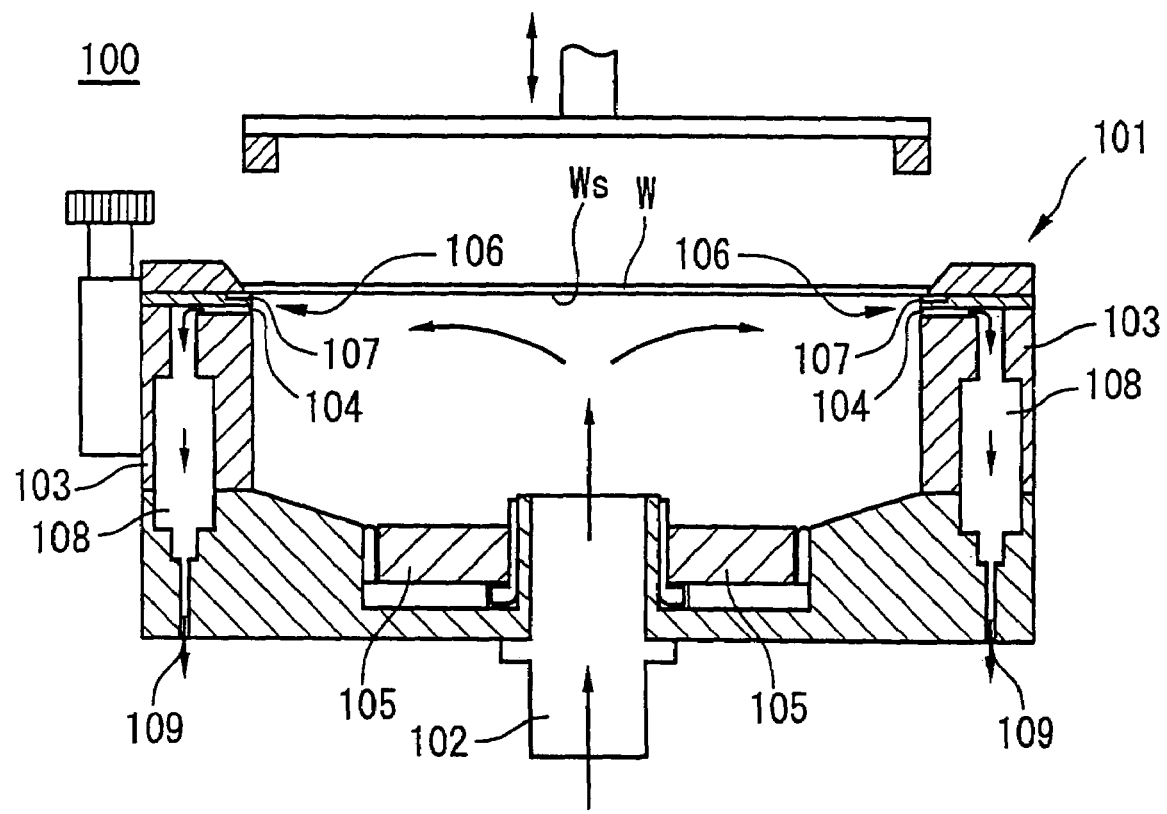
FIG. 6 is a sectional view showing a conventional cup-shaped plating apparatus.

As shown in FIG. 3, four discharge ports 31 of the same shape are formed in the plate 30 at equal intervals. These four discharge ports 31 are arranged so as to surround the plating tank 10 when the plate 30 is attached to the lower part of the cavity portion 16. As is apparent from the details shown in FIG. 4, each of the discharge ports 31 is constructed by attaching a rubber hole piece 32 to a through hole 30a formed in the plate 30. The hole piece 32 is annular and on the outer periphery of the annulus is formed a groove portion 32a which extends along the whole circumference of the annulus. When the hole piece 32 is mounted on the plate 30, this groove portion 32a bites the opening edge of the through 30a, whereby falling off is prevented when the hole piece 32 is mounted in the through hole 30a. Incidentally, the contour of the inner peripheral edge of the hole piece 32, i.e., the shape and opening area of the discharge port 31 can be arbitrarily set in a range which does not exceed the size of the through hole 30a. In this embodiment, as shown in the figure, a hole piece provided with slotted holes (discharge ports 31) which extend in the shape of a circular arc is used.

In a position below the cavity portion 16 is provided a collection tank 40 which houses the plating solution discharged through the discharge ports 31. A hose 41 is connected to this collection tank 40. This hose 41 feeds the plating solution collected by the collection tank 40 to a plating solution circulation device R.

Next, plating treatment performed by use of a cup-shaped plating apparatus of this embodiment will be described in the order of steps.

First, a substrate W which is an object to be plated, such as a wafer, is installed on the plating apparatus 1. Concretely, when the outer peripheral portion of the substrate W is placed on the placement portion 20, with the plating target surface Ws of the wafer W directed downward (toward the interior of the plating tank 10). A seed (not shown), which is a foil film made of gold (Au) to ensure a good conducting condition, is formed on the external peripheral portion of the plating target surface Ws, and when the substrate W is placed on the placement portion 20, the seed of the substrate W comes into contact with the cathode 23. In addition, an annular convex portion 22a of the seal packing 22 positioned inside the cathode 23 comes into contact with the outer peripheral portion of the plating target surface Ws. After that, the substrate W is pressed against the placement portion 20 by means of a holding member 27 and is fixed to the plating tank 10 by being positively brought into contact with the convex portion 22a of the seal packing 22 and the cathode 23.

When the substrate W is placed on the placement portion 20 and fixed thereto, the plating target surface Ws of the substrate W comes into contact with the plating solution filled in the plating tank 10. As described earlier, the outer peripheral portion of the plating target surface Ws is in contact with the convex portion 22a of the seal packing 22 along the whole circumference of the outer peripheral portion and hence the plating solution does not leak from between the substrate W and the placement portion 20. By the energizing between the cathode 23 and the anode 26 within the plating tank 10 in this state, the plating target surface Ws of the substrate W is subjected to plating treatment to form a plating film.

In the cup-shaped plating apparatus 1, usually a plating target surface is subjected to plating treatment during the feed of a plating solution into the plating tank 10. The flow of the plating solution during plating treatment will be described below.

First, the plating solution is fed from the supply tube 28 provided on the bottom surface 10a of the plating tank 10 into the plating tank 10. During plating treatment, the interior of the plating tank 10 is filled with the plating solution and the plating solution which has been fed from the supply tube 28 into the plating tank 10 flows toward the plating target surface Ws while forming an upward current in the central region within the plating tank 10. And when the plating solution has risen to a certain degree, the plating solution begins to flow toward the outer peripheral side of the plating tank 10 in a radially spreading pattern.

When the plating solution has been fed into the plating tank 10, the plating solution flows out of the outlet port 11 into the cavity portion 16 in an amount corresponding to the volume of supplied plating solution. The plating solution which has flowed into the cavity portion 16 is temporarily stored in the cavity portion 16 and is then discharged from the discharge port 31 at the bottom end of the cavity portion 16 into the collection tank 40. The plating solution which has been housed in the collection tank 40 is fed to the circulation device R via the hose connected to the collection tank 40. The plating solution which has been fed to the circulation device R is here brought into a state capable of recycle by filtration and composition adjustment and is then fed to the plating solution tank T, where the fed plating solution is recycled.

Incidentally, in this plating apparatus, it is possible to change and adjust the shape and opening area of the discharge port 31 of the cavity portion 16 by replacing the hole piece 32 attached to the plate 30 at the bottom end of the cavity portion 16, and the change and adjustment are easy. By changing and adjusting the shape and opening area of the discharge port 31, it is possible to adjust the flowability of the plating solution out of the outlet port 11, and it is possible to adjust the plating condition in the outer peripheral region of the plating target surface.

Now an experiment with the plating of a wafer conducted by use of the plating apparatus of this embodiment will be described. In this plating experiment, the wafer was plated and after that, the plating film thickness (variations in film thickness) was measured.

EXAMPLE 1

In this embodiment, a plate 30 as shown in FIG. 3 was attached to the bottom end of the cavity portion 16. That is, the discharge port 31 had the shape of a slotted hole. Incidentally, the wafer to be plated had a diameter of 200 mm and the diameter of the plating target surface was 190 mm. The plating solution was a copper sulfate solution (solution temperature: 20° C.) and this plating solution was continuously fed through the supply tube into the plating tank at a rate of 15 liters/minute. The theoretical current density on the plating target surface during energization was 1 A/dm$^2$.

COMPARATIVE EXAMPLE 1

This comparative example differs from Example 1 in the conditions for the shape and/or opening area of the discharge port. Concretely, a plate having a circular discharge port was attached to the bottom end of the cavity portion. Incidentally, the total opening area of the discharge port was the same as in Example 1. Other conditions were the same as in First Example and their descriptions are omitted. The experiment conditions are shown in Table 1.

TABLE 1

|  | Average plating film thickness (μm) | Variations in film thickness (standard deviation: σ) |
|---|---|---|
| Example 1 | 21.0 | 0.2 |
| Comparative Example 1 | 21.0 | 0.3 |

As shown in Table 1, the standard deviation (σ) showing the state of variations in film thickness was 0.2 μm in Example 1 in which the shape of the discharge port is a slotted hole. This value was smaller than the case of Comparative example 1 in which the shape of the discharge port is a circle (σ: 0.3 μm). As a result, it became apparent that in the case where the discharge port has the shape of a slotted hole, the occurrence of nonuniformity and variations in the plating film thickness is suppressed, with the result that the whole area of the plating target surface of a wafer can be subjected to plating with a uniform film thickness. As a result, it became apparent that if the construction is such that the shape and opening area of the discharge port can be changed, it is possible to perform setting to obtain a condition in which the best plating with small nonuniformity and variations can be ensured by actually performing plating treatment by changing the shape and opening area of the discharge port.

Incidentally, various structures other than the structure of this embodiment are conceivable as the structure for changing the shape and/or opening area of the discharge port. For example, because the plating apparatus of this embodiment is of such a structure that permits the replacement of the plate 30, a structure which permits. the replacement of the plate in place of the hole piece may be adopted. In this case, multiple types of plates having different shapes and/or opening areas of the discharge port are prepared and the shape and/or opening area of the discharge port is adjusted by replacing the plate in accordance with the conditions. In the above experiment, a wafer is plated with copper. However, the object to be plated is not limited to a wafer and the present invention can be widely applied to electrically conductive metals in general, such as a stainless steel sheet. Also, the plating metal is not limited to copper and it is possible to perform plating with various metals such as nickel (Ni) and gold (Au).

INDUSTRIAL APPLICABILITY

According to the cup-shaped plating apparatus related to the present invention, it is possible to perform plating with a uniform film thickness in plating the plating target surface of an object to be plated, such as a wafer.

The invention claimed is:

1. A cup-shaped plating apparatus comprising: a plating tank for storing a plating solution; a placement portion for an object to be plated, which is provided at an opening end of the plating tank; means for feeding plating solution into the plating tank; a plating solution outlet port which is formed in an inner circumferential surface of the plating tank; a cavity portion into which plating solution flows from the outlet port; a plate within the cavity portion, the plate having discharge ports, which discharge ports allow plating solution to flow therethrough, and which discharge ports comprise slotted openings having hole pieces detachably mounted in the slotted openings, each defining an opening area; and a collection tank for plating solution discharged from the discharge ports, wherein the shape and/or the opening area of the discharge ports is changeable.

2. The cup-shaped plating apparatus according to claim 1, wherein the cavity portion is formed so as to surround the plating tank and a plurality of discharge ports are formed on the downstream side of the flow direction of the plating solution in the cavity portion so as to surround the plating the plating tank.

3. The cup-shaped plating apparatus according to claim 1 which further comprises an anode and a cathode within the plating tank.

4. A cup-shaped plating apparatus comprising: a plating tank having an upper opening end, which plating tank is capable of storing a plating solution therein; a placement portion at the upper opening end of the plating tank for retaining an object to be plated; a supply device for feeding a plating solution into the plating tank; a plating solution outlet port which is formed through an inner circumferential surface of the plating tank; a cavity portion capable of receiving plating solution which has flowed from the outlet port; a plate within the cavity portion, the plate having discharge ports, which discharge ports allow plating solution to flow therethrough, and which discharge ports comprise slotted openings having hole pieces detachably mounted in the slotted openings, each defining an opening area; and a collection tank for receiving plating solution discharged through the discharge ports, wherein the shape and/or the opening area of the discharge ports is changeable.

5. The cup-shaped plating apparatus according to claim 4, wherein the cavity portion is formed so as to surround the plating tank, and the apparatus comprising a plurality of discharge ports within the cavity portion, which discharge ports are formed on a downstream side of a flow direction of the plating solution in the cavity portion so as to surround the plating the plating tank.

6. The cup-shaped plating apparatus according to claim 4 which further comprises an anode and a cathode within the plating tank.

7. The cup-shaped plating apparatus according to claim 4 which further comprises an arrangement for filtering and adjusting the composition of the plating solution from the collection tank and recycling the filtered and composition adjustment plating solution to the plating tank.

8. A method for plating an object which comprises:
    a) providing a cup-shaped plating apparatus comprising: a plating tank having an upper opening end, which plating tank is capable of storing a plating solution therein; a placement portion at the upper opening end of the plating tank for retaining an object to be plated; a supply device for feeding a plating solution into the plating tank; a plating solution outlet port which is formed through an inner circumferential surface of the plating tank; a cavity portion capable of receiving plating solution which has flowed from the outlet port; a plate within the cavity portion, the plate having discharge ports, which discharge ports allow plating solution to flow therethrough, and which discharge ports comprise slotted openings having hole pieces detachably mounted in the slotted openings, each defining an opening area; and a collection tank for receiving plating solution discharged through the discharge ports, wherein the shape and/or the opening area of the discharge ports is changeable;

b) placing an object to be plated on the placement portion of the plating tank;

c) subjecting the object to be plated to a plating treatment while feeding a plating solution from the supply device into the plating tank such that the plating solution contacts the object to be plated, then flowing the plating solution through the outlet port and into the cavity portion, and then flowing the plating solution through the discharge ports and into the collection tank.

9. The method of claim 8 further comprising the step of changing the shape or opening area of the discharge port.

10. The method according to claim 8, wherein the cavity portion is formed so as to surround the plating tank, and the apparatus comprises a plurality of discharge ports within the cavity portion, which discharge ports are formed on a downstream side of a flow direction of the plating solution in the cavity portion so as to surround the plating the plating tank.

11. The method according to claim 8, wherein the object to be plated comprises a semiconductor wafer.

12. The method of claim 8 wherein the cup-shaped plating apparatus further comprises an anode and a cathode within the plating tank.

13. The method of claim 8 wherein the plating treatment comprises electrolytic plating.

14. The method of claim 8 further comprising filtering and adjusting the composition of the plating solution from the collection tank and recycling the filtered and composition adjustment plating solution to the plating tank.

* * * * *